United States Patent
Forstén et al.

(12) 
(10) Patent No.: US 6,342,266 B1
(45) Date of Patent: Jan. 29, 2002

(54) METHOD FOR MONITORING SOLDER PASTE PRINTING PROCESS

(75) Inventors: Atso Forstén, Sauvo; Timo Liukkonen, Salo, both of (FI)

(73) Assignee: Nokia Mobile Phones Limited, Salo (FI)

( * ) Notice: Subject to any disclaimer, the term of this patent is extended or adjusted under 35 U.S.C. 154(b) by 567 days.

(21) Appl. No.: 08/734,866

(22) Filed: Oct. 22, 1996

(30) Foreign Application Priority Data

Dec. 13, 1995 (FI) .................................................. 95597

(51) Int. Cl.$^7$ ................................................ B05D 5/12
(52) U.S. Cl. .............................. 427/96; 427/8; 427/282
(58) Field of Search .............................. 427/96, 8, 282; 118/663, 712

(56) References Cited

FOREIGN PATENT DOCUMENTS

| JP | 3-244188 | * | 1/1992 |
| JP | 4-212005 | * | 11/1992 |

OTHER PUBLICATIONS

Patent Abstracts of Japan vol. 16, No. 31 (E–1159), Jan. 27, 1992 & JP 03 244188 A (Fujitsu), Oct. 30, 1991.
Patent Abstracts of Japan vol. 17, No. 76 (P–1487), Feb. 16, 1993 & JP 04 279808 A (Sharp Corp), Oct. 5, 1992.
Patent Abstracts of Japan vol. 15, No. 199 (M–1115), May 22, 1991 & JP 03 052761 A (Matsushita Electric Ind Co), Mar. 6, 1991.
Patent Abstracts of Japan vol. 17, No. 615 (E–1459), Nov. 12, 1993 & JP 05 191034 A (Sharp Corp), Jul. 30, 1993.
Patent Abstracts of Japan vol. 17, No. 639 (M–1515), Nov. 26, 1993 & JP 05 200991 A (Matsushita Electric Ind Co), Aug. 10, 1993.
Patent Abstracts of Japan, vol. 16, No. 31, Jan. 27, 1992, publication No. 3–244 188.
Patent Abstracts of Japan, vol. 16 No. 555, Nov. 25, 1992, publication No. 4–212 005.

* cited by examiner

*Primary Examiner*—Brian K. Talbot
(74) *Attorney, Agent, or Firm*—Perman & Green, LLP

(57) ABSTRACT

The invention relates to a method for monitoring the paste printing process in the setting and soldering of a circuit board. In the paste printing process, solder paste (5) is spread on the circuit board (4) at the surface mounted devices to be set or at the corresponding solder pads (7) of the connecting pins. According to the invention, at least one paste test pattern (9) is arranged on the circuit board (4), which test pattern consists of a number of test elements (91, 92, 93, 94), shaped like geometrical plane figures on the surface of the circuit board, and which test elements have varying degrees of difficulty in view of the printing process.

10 Claims, 3 Drawing Sheets

METHOD FOR MONITORING SOLDER PASTE PRINTING PROCESS

This invention relates to a method according to the preamble of the independent claim for monitoring the solder paste printing process in the setting and soldering of a circuit board.

Most of the electronic components used today are surface mounted devices. The components are placed on the surface of the circuit board at predetermined places with regard to the wiring pattern. Before the installation of the surface mounted devices, a paste-like solder alloy is printed on the surface of the circuit board at the solder pads of the components. After this, the surface mounted devices are assembled on the circuit board. The components stay where they are put, because the connection pins of the components stick to the paste deposits of the solder pads. When the components have been assembled, the circuit boards are arranged to go through a furnace where the paste deposits melt. When the circuit boards cool down, the paste hardens and the surface mounted devices have been fastened on the surface of the circuit board by means of solder joints.

The above described solder paste printing process is very sensitive and requires constant monitoring and control in order to achieve the optimum solder quality. It is also to be noted that the size of the components has continuosly decreased, and thus also the size of the terminal pins and solder pads and the gaps between them have decreased, and consequently the requirements for the solder paste printing process have also increased.

The solder paste printing process has earlier been monitored randomly by examining the paste printed circuit board with a microscope. With the naked eye, without any instrument, it is difficult or nearly impossible to perceive a difference in the coverage area of paste deposites at the solder pads of normal components, even if the difference is considerable. The object of the invention is to provide a new method for monitoring the solder paste printing process in the component setting and soldering of a circuit board.

According to the invention, in the method for monitoring the solder paste printing process in the setting and soldering of a circuit board in order to evaluate the quality of the paste printing process, at least one paste test pattern is applied on the circuit board. The test pattern consists of a number of test elements, shaped like geometrical plane figures arranged on the surface of the circuit board, which test elements are of varying degree of difficulty in view of the printing process.

The inventive idea is to use geometrical test patterns printed with paste, such as rectangular test patterns, as the indicators of the capability of the solder paste printing process. The shape and/or size and/or gaps between the test elements used in the test patterns varies systematically in a manner such that the test patterns have various degrees of difficulty in printing. The test figures can be classified according to the degree of difficulty in printing, and according to the classes of difficulty, the solder paste printing process used can be classified into predetermined classes in inspection, and the solder paste printing process can be given a ratio that describes its capability.

In this connection, the term circuit board is used to refer to circuit boards in general, meaning both the actual circuit board on which the components are set and soldered, and a circuit board billet which can comprise one or more actual circuit boards. The solder paste test pattern can be arranged on the actual circuit board, if it has room for it, or on the circuit board billet outside the actual circuit board(s) arranged on it. The solder paste test pattern can be arranged separately from the solder pads of the actual components, or, if it has been arranged on the actual circuit board, its test elements can include solder pads used for fastening the components. Thus the test pattern can, in some applications, be arranged among the solder pads so that the solder pads are used to constitute at least a part of the test pattern.

An advantage of the method according to the invention is the fact that by means of it the solder paste printing process can be reliably monitored and verified. When the test pattern is used, random checks of the printed solder pads of the surface mounted devices before the soldering process can be eliminated.

Another advantage of the method according to, the invention is the fact that it can be used to determine the capability of the solder paste printing process and the accuracy of the parameters used in the printing process. These factors can have a considerable improving effect on the quality of the soldering process. Consequently, inspection of the circuit boards with surface mounted devices after the process can be given up or at least substantially reduced.

Furthermore, it is an advantage of the invention that the same test pattern can be used in the production of many kinds of circuit boards, when surface mounted devices are used in the process.

Due to the invention, the monitoring process in the manufacture of circuit boards becomes less complicated. For example, one part of the test pattern, such as one test element, can be used after the soldering as a test point which is connected to an electric circuit. On the other hand, non-contacting inspection methods, such as a camera system, can also be used.

In addition, due to the invention it is possible to get comparable monitoring results of the manufacture of circuit boards, regardless of which product is manufactured on the circuit board production line. The method according to the invention also provides a possibility for automatic monitoring of the solder paste printing process. It is to be noted that since the production line is used to manufacture different circuit boards for different products, with different arrangements of solder pads, there has not been a single, comparable monitoring method for these circuit boards available earlier, but the monitoring criteria had to be defined for each product individually.

In the following, the invention will be described in more detail with reference to the appended drawings, in which FIG. 1 shows a cross-section of the solder paste printing process;

In this invention report, setting and soldering of the circuit board means the arrangement and fastening of components, which transmit and/or process electricity and/or electric signals, on the circuit board, which itself contains the wiring between the components and possibly also connections to peripheral devices.

The electronic components used today, the VLSI circuits in particular, are most often surface mounted devices (SMD).

These components are set on the surface of the circuit board. The circuit board contains the wiring which connects various components and other electric devices, such as connectors. In order to attach the surface mounted devices on the surface of the circuit board, a paste-like solder alloy is printed at the solder pads which correspond to the connecting pins. Paste deposits of a suitable size are thus formed at the solder pads. After this, the surface mounted devices are set on the circuit board. The components stay where they are put on the circuit board, because they stick to the paste deposits of the solder pads at their connecting pins. After the setting, the circuit boards are arranged to go through a hot furnace, where the paste melts and the components are fastened in place at the connecting pins. When the circuit board cools down, the paste hardens and the solder joint at the solder pad of each connecting pin is complete.

Figure 1:
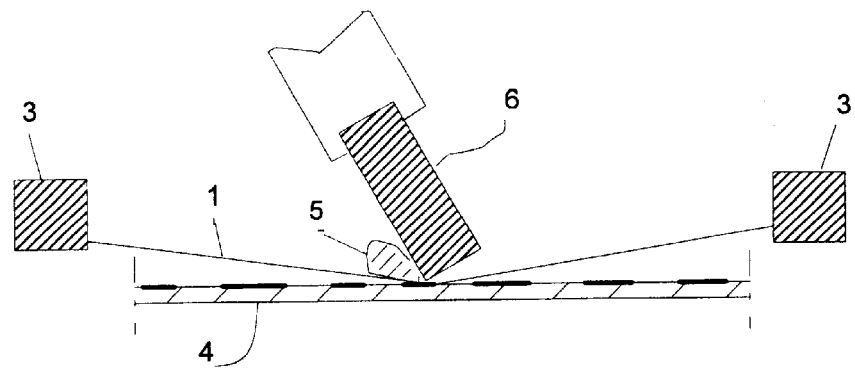
Figure 2:
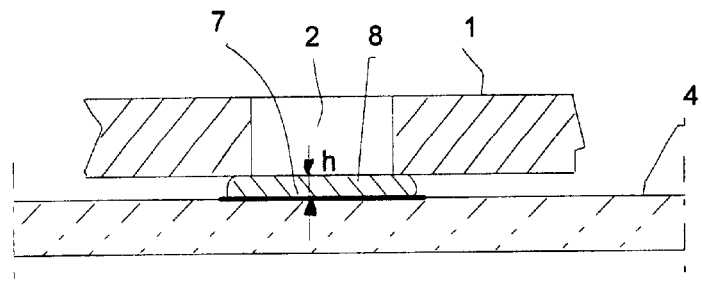
FIG. 2 shows an enlarged cross-section of the solder pad on which the paste deposit has been applied in the paste printing process.

The principle of the surface mounting process is illustrated in the FIGS. 1 and 2. A printing mask or stencil 1, which is a thin metal plate, for example, is used in the surface mounting process. Openings 2 have been etched on the stencil 1 at the solder pads 7 reserved for the connecting pins of the surface mounted devices. The stencil 1 is fastened to a frame 3. In the solder paste printing process, the stencil 1 fastened to the frame 3 is placed on the surface of the circuit board 4 or in close vicinity to it at a precisely specified point so that the openings 2 match the solder pads 7. Solder paste 5 is applied on the upper surface of the stencil 1. The paste 5 is spread with a special spatula 6 over the circuit board 4 so that the paste fills the openings 2 of the stencil 1 and is squeezed onto the surface of the circuit board 4 at the predetermined solder pads 7. When the stencil 1 is lifted off from the circuit board 4, the paste remains as deposits 8 of suitable height h on the surface of the circuit board 4 at the openings 2 and solder pads 7.

The solder pads 2 of the surface mounted device on the circuit board 4 are generally rectangular areas, the size of which corresponds to the size and shape of the connecting surface of the connecting pins of the component. The solder pads 7 are arranged at distances which correspond to the distance of the connecting pins of the components and in a shape that corresponds to the shape formed by the connecting pins of the component.

The coverage area of the paste deposit 8 depends on the width and length of each opening 2 of the stencil 1. In addition, the height of the paste deposits 8 depends on the thickness of the stencil 1 (height h of paste deposit, see e.g. FIG. 2). The size of the openings made in the stencil 1 is determined by the size of the solder pad spots in the photographic film used in the manufacture of the stencil. The solder pad spots are usually a little smaller than the solder pads, but when the openings 2 are etched in the stencil 1, they are generally slightly overetched and thus they become the size of the solder pads 7. If it seems that the amount of paste applied on the solder pad 7 with the stencil 1 is not appropriate, the solder pad spots of the photographic film can be decreased or increased according to need, and a new stencil 1 with openings 2 of the right size can be made.

The purpose of the solder paste printing process is to achieve a right-sized paste deposit 8 on the solder pads 7, or a sufficient amount of paste; not too much and not too little, so that the connecting pins can be fastened by a solder joint reliably on the solder pads 7 reserved for them and related to the wiring. The method of the invention is used particularly for verifying the right size of the paste deposits.

Figure 3:
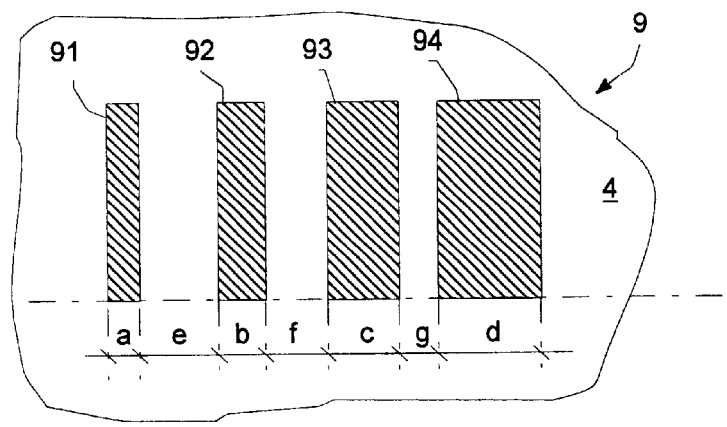
FIG. 3 shows one advantageous test pattern for estimating the quality of the paste printing process.

When the FIG. 3 is examined, it can be seen that a paste test pattern 9, separate from the actual solder pads 7 of the components, has been applied on the circuit board 4, which test pattern 9 comprises a number of geometrical test elements 91, 92, 93, 94. These test elements are of varying degree of difficulty in printing.

The test pattern 9 in FIG. 3 consists of four rectangular test elements 91, 92, 93, 94, which are of different widths, denoted by a, b, c and d, respectively. In addition, the test elements 91, 92, 93, 94 are arranged in a straight line in sequence at different distances from each other in a manner such that the distance between the test elements 91, 92 is e, the distance between 92 and 93 is f, and the distance between 93 and 94 is g. The relation between the test elements 91, 92, 93 and 94 is preferably the following: a<b<c<d. The relation between the distances of the test elements 91, 92, 93 and 94 is preferably the following: e>f>g. Furthermore, the test elements 91, 92, 93 and 94 are in this application essentially rectangular in shape.

Figure 4:
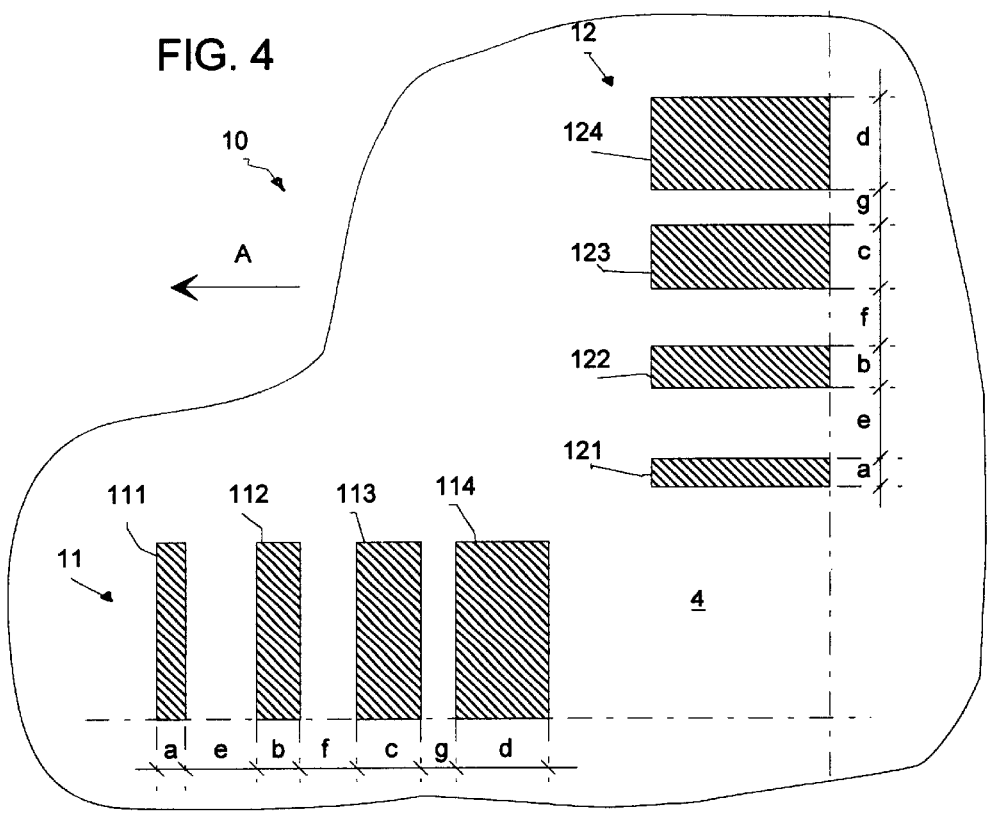
FIG. 4 shows another advantageous test pattern for estimating the quality of the paste printing process.

In another advantageous embodiment of the invention, the test elements of the test pattern 10 are arranged in two sets 11, 12, as shown in FIG. 4. Both sets consist of test elements which are essentially rectangular in shape and of different widths. Set 11 consists of the elements 111, 112, 113, 114, and set 12 consists of the elements 121, 122, 123 and 124. Both sets 11, 12 can be like the test pattern 9 shown in the preceding FIG. 3. The test elements 111, 112, 113, 114; 121, 122, 123, 124 of both sets 11, 12 are thus arranged in sequence in a straight line at different distances from each other. In this application, the sets 11, 12, or rows of test elements are at an angle, preferably a 90° in relation to each other.

When the test pattern 10 is formed of two sets of test elements 11, 12, which are arranged at an angle in relation to each other, as shown in FIG. 4, possible changes of the paste printing process can be looked at both horizontally and vertically, or aligned with the direction of the printing process (moving direction A of the spatula 6) and perpendicularly against it. Thus any possible defects of the printing process in both main directions can be checked with the same test pattern.

The openings of the test pattern 9, 10 are made in the stencil 1 in the same way as openings 2 are generally made in it for the solder pads 7 (cf. FIG. 2). By means of the paste printing process, paste testing areas or test patterns 9, 10, separate from the normal solder pads 7, are applied on the circuit board, which test patterns can then be used for assessing the quality of the paste printing process. Paste deposits according to the test pattern 9, 10 can be examined either visually (by microscope etc.) or by means of separate monitoring equipment.

Figure 5:
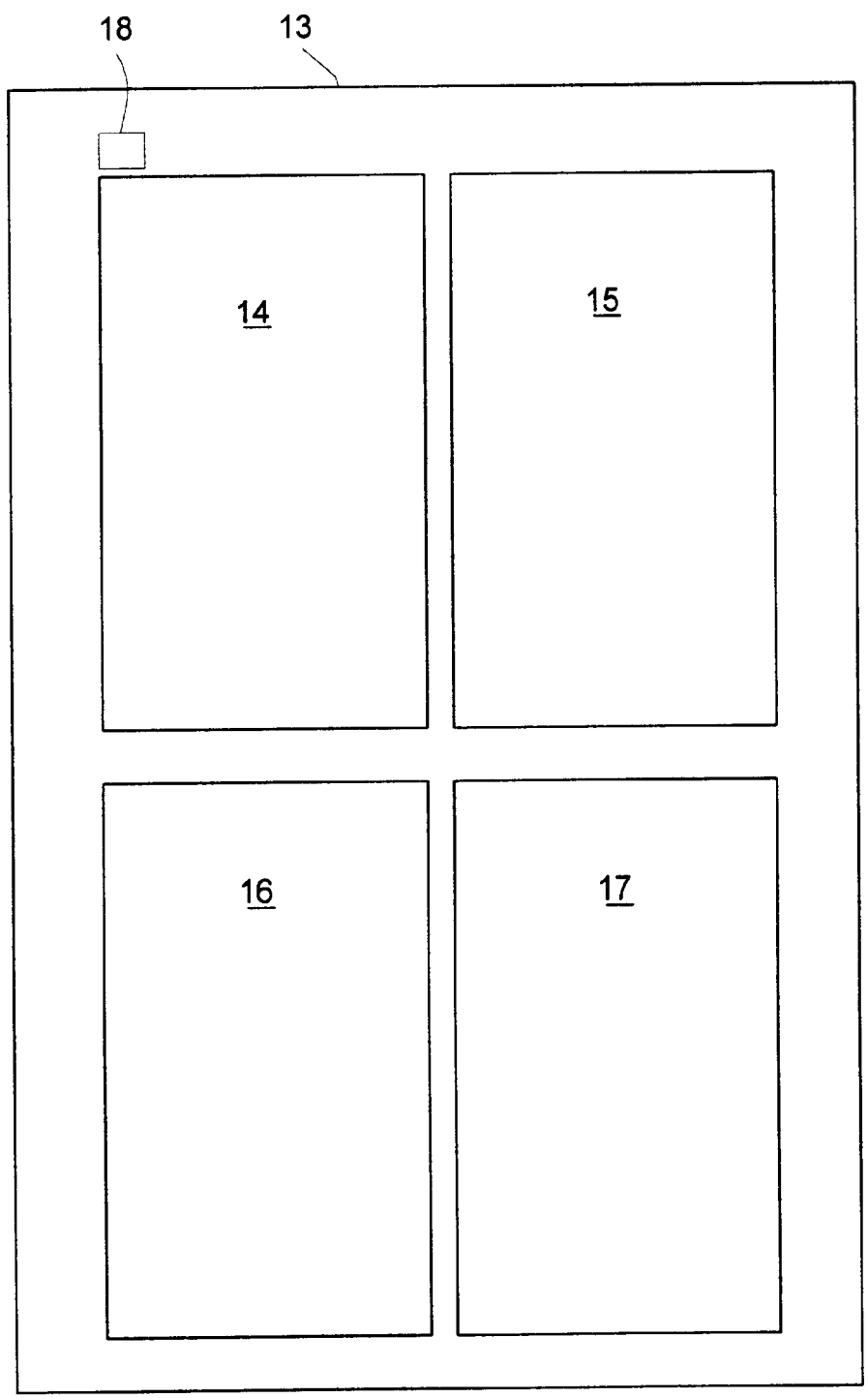
FIG. 5 shows a circuit board panel which comprises many circuit boards, in which circuit board billet a test pattern has been applied.

FIG. 5 shows a circuit board billet 13, on which a number of actual circuit boards 14, 15, 16, 17 have been arranged. In this case, a paste test pattern 18 according to the invention can preferably be arranged on the circuit board billet 13 outside the actual circuit boards 14, 15, 16, 17. Thereby, when the circuit boards are complete, the results of the paste printing process can be simply checked from the test pattern 18 arranged on the circuit board billet, which test pattern will be eventually disposed of when the circuit boards have been detached from the billet 13. The test pattern 18 can be similar to the test pattern 10 in FIG. 4, for example.

When the paste printing process is monitored by the method according to the invention, in the paste test patterns 9; 12; 18 are monitored, particularly the coverage area (width a, b, c, d) and/or height (h) of the test deposits according to the test elements 91, 92, 93, 94; 101, 102, 103, 104, 111, 112, 113, 114 of these test patterns and the gaps e, f, g between the test elements of these test patterns. Thus all kinds of changes in the paste printing process can be monitored by means of the test patterns.

If the widths a, b, c, d of the test elements 91, 92, 93, 94 of the test pattern 9 have been chosen appropriately, as shown in FIG. 3, for example, the results of the monitoring can be classified according to how well the paste printing process has succeeded for each test element 91, 92, 93, 94. If the smallest test element 91 has an area of just the required size and the paste deposit in it has the right amount of paste, the printing process can be regarded as successful in all respects; the paste printing process belongs to the first or best printing class. A prerequisite for this is that the printing of the other test elements 92, 93, 94 has also succeeded. If the first test element 91 of the test pattern 9 has failed and the other test elements 92, 93, 94 have passed, the paste printing process can be classified as belonging to the second, or second best, printing class. Similarly, on the basis of the printing result of different test elements 92, 93, 94, the whole printing process can be classified into subclasses that reflect the printing quality.

The gaps between the test elements of the test pattern, such as the gaps e, f, g, between the test elements 91, 92, 93, 94 can also be used to evaluate the capability of the paste printing process. The pass/fail status of the gaps can be determined on the basis of the gaps being free of paste or partly filled by it. If all the gaps between test elements 91, 92, 93, 94 are free of paste, the printing process can be classified into the first or best quality class. If the gap between the test elements 93, 94, with a distance g, is at least partly filled by paste, the quality of the printing process does not meet the requirements of the first class but it belongs to the second, lower quality class. Similarly, the quality classification can be lowered, if paste is found during inspection in the gaps between the test elements 92, 93, 94, with distances f, e.

Figure 6:
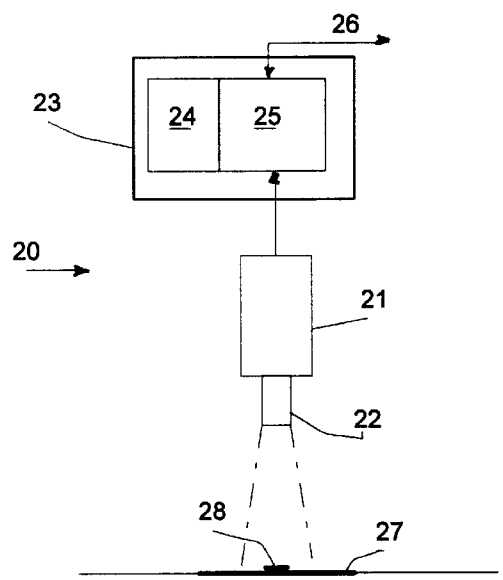
FIG. 6 shows a diagrammatic plan of automatic monitoring equipment for the paste printing process.

The quality of the paste printing process can also be monitored automatically by means of suitable monitoring equipment, as is shown by an illustrative example in FIG. 6. The monitoring equipment 20 comprise one or more camera (s) 21, such as a semiconductor camera which is equipped with a suitable lense arrangement 22, and a monitoring unit 23, to which the camera 21 is connected. The monitoring unit 23 consists of a memory unit 24 and a processing unit 25. The shape of test patterns to be arranged on the circuit boards, such as the pattern 9 of FIG. 3, including e.g. the shape/s and dimensions of the elements of the test pattern, have been saved in the memory unit 24. Suitable application programs for automatic testing have also been saved in the memory unit 24. The test results, such as an alarm of process disturbances, are given out from the monitoring equipment 20 through a suitable connection 26 for handling by the monitoring personnel.

The monitoring equipment 20 function in the following manner, for example. The circuit boards 27, which have passed through the paste printing process, are arranged to go through the observation field and exposure area of the camera 21 on a suitable conveyer in a manner such that the test pattern 28 can be photographed by the camera. The processing unit 25 compares the test patterns 28 of the circuit board 27 photographed by the camera 21 to the shapes of test patterns saved in the memory unit 24 by means of the application programs, and observes the differences on the basis of which the quality of the paste printing process is evaluated in accordance with agreed criteria, such as the criteria described above.

In the FIGS. 3 and 4 above, various test patterns 9; 10, 11, have been presented by way of example. It is to be noted, however, that the test patterns can differ from those presented. The test pattern can consist of test elements with different basic geometrical shapes, such as rectangle, square, circle etc. These test elements can be arranged at different distances from each other. The test elements of a test pattern can contain parts of mutually different width. In general, it can be said that the paste test pattern consists of geometrical plane figures, which can vary and have gaps of different width between them, so that different parts of the test pattern have different degrees of difficulty in view of paste printing.

What is claimed is:

1. A method for implementing a process for monitoring the solder paste printing process in the setting and soldering of a circuit board, in which paste printing process solder paste (5) is spread on a circuit board (4) at the solder pads (7) of surface mounted devices or corresponding connecting pins, characterized in that for evaluating the quality of the paste printing process at least one paste test pattern (9; 10; 18) is arranged on the circuit board (4; 13), which test pattern is constituted by a number of test elements (91, 92, 93, 94; 111, 112, 113, 114; 121, 122, 123, 124), the shapes of which correspond to geometrical plane figures on the surface of the circuit board, which test elements have varying degrees of difficulty in view of the printing process, and wherein the spatial relationship between test elements is such that the distance between one test element and another is different and each of said test elements has different width and the distance between consecutive elements is smaller as the widths of each said test element becomes larger.

2. A method according to claim 1, characterized in that the test pattern is constituted by test elements of different shapes, corresponding to geometrical plane figures.

3. A method according to claim 1, characterized in that the test elements (91, 92, 93, 94) of the test pattern (9) are arranged at different distances (e, f, g) from each other.

4. A method according to claim 1, characterized in that the test elements (91, 92, 93, 94) contain parts of mutually different widths (a, b, c, d).

5. A method according to claim 1, characterized in that the test pattern (9) is constituted by test elements (91, 92, 93, 94), essentially rectangular in shape, which have different widths (a, b, c, d).

6. A method according to claim 5, characterized in that the test pattern (9) is constituted by four test elements (91, 92, 93, 94), which have been arranged at different distances (e, f, g) from each other.

7. A method according to claim 5, characterized in that the test pattern (10) consists of two sets of test elements (11, 12), each of which sets consists of a number of test elements (111, 112, 113, 114; 121, 122, 123, 124), which have been arranged at different distances from each other and each of which sets is at an angle, preferably a 90 degree angle, in relation to each other.

8. A method according to claim 1, characterized in that the test pattern (18) is arranged on the circuit board (13), which comprises several circuit boards (14, 15, 16, 17).

9. A method according to claim 1, characterized in that the paste printing process is monitored on the basis of the test pattern automatically by means of monitoring equipment (20).

10. A method according to claim 9, characterized in that the monitoring is implemented by means of monitoring equipment (20) constituted by a camera (21) and a monitoring unit (23) connected to it, which monitoring unit consists of a memory unit (24), to which the shape of the test pattern (28) has been saved, and a processing unit (25), in which processing unit (25) the test patterns (28) photographed with the camera (21) are compared to the saved shapes of test patterns and the differences are observed, on the basis of which differences the quality of the paste printing process is evaluated.

* * * * *

UNITED STATES PATENT AND TRADEMARK OFFICE
CERTIFICATE OF CORRECTION

PATENT NO.     : 6,342,266 B1
DATED          : January 29, 2002
INVENTOR(S)    : Forsten et al.

Page 1 of 1

It is certified that error appears in the above-identified patent and that said Letters Patent is hereby corrected as shown below:

<u>Title page,</u>
Item [30], Foreign Application Priority Data, the Finnish priority application number should read -- 955971 --.

Signed and Sealed this

Twenty-fourth Day of September, 2002

Attest:

Attesting Officer

JAMES E. ROGAN
*Director of the United States Patent and Trademark Office*